United States Patent
Jeon-Haurand

(10) Patent No.: US 10,498,069 B2
(45) Date of Patent: Dec. 3, 2019

(54) PLUG-IN MODULES AND PLUG-IN MODULE SYSTEMS

(71) Applicant: Hyeon Sook Jeon-Haurand, Brühl (DE)

(72) Inventor: Hyeon Sook Jeon-Haurand, Brühl (DE)

(*) Notice: Subject to any disclaimer, the term of this patent is extended or adjusted under 35 U.S.C. 154(b) by 0 days.

(21) Appl. No.: 16/317,882

(22) PCT Filed: Aug. 1, 2017

(86) PCT No.: PCT/DE2017/000241
§ 371 (c)(1),
(2) Date: Jan. 15, 2019

(87) PCT Pub. No.: WO2018/024273
PCT Pub. Date: Feb. 8, 2018

(65) Prior Publication Data
US 2019/0252819 A1    Aug. 15, 2019

(30) Foreign Application Priority Data

Aug. 4, 2016  (DE) ............... 20 2016 004 792 U
Jun. 1, 2017  (DE) ............... 10 2017 005 223

(51) Int. Cl.
*H01R 13/60*  (2006.01)
*H01R 13/514*  (2006.01)
(Continued)

(52) U.S. Cl.
CPC ....... *H01R 13/514* (2013.01); *H01R 13/6616* (2013.01); *H01R 13/7175* (2013.01);
(Continued)

(58) Field of Classification Search
CPC ............. H01R 13/518; H01R 23/7073; H01R 13/748; H01R 23/025; H01R 23/7042; H01R 9/2408
(Continued)

(56) References Cited

U.S. PATENT DOCUMENTS 6,345,902 B2 *  2/2002  Ohkohdo ............. B60Q 1/2696
                                                    362/549
6,386,733 B1 *  5/2002  Ohkohdo ............. B60Q 1/2696
                                                    362/249.06
(Continued)

OTHER PUBLICATIONS

International Search Report for International Application PCT/DE2017/000241, dated Oct. 17, 2017.
(Continued)

*Primary Examiner* — Phuong Chi Thi Nguyen
(74) *Attorney, Agent, or Firm* — Burris Law, PLLC

(57) ABSTRACT

A plug-in module circuit board includes a plurality of plug-in modules attached to each other side-by-side in a lateral longitudinal row. Each of the plurality of plug-in-modules has an electrical contact and each of the electrical contact housings has at least one outer surface with a latching structure, a pair of upper guide bores a pair of electrical contacts ad pair of locking devices in the pair of upper guide bores, and a common electrical voltage connection in communication with each of the electrical contacts such that each of the electrical contacts has a common electrical voltage provided thereto. One connecting leg of a light emitting diode (LED) is locked in one electrical contact housing and another connecting leg of the LED is locked in an adjacent electrical contact housing such that each leg of the LED has a different polarity voltage applied thereto.

16 Claims, 21 Drawing Sheets

(51) Int. Cl.
  *H01R 33/02*    (2006.01)
  *H01R 33/88*    (2006.01)
  *H01R 33/92*    (2006.01)
  *H01R 13/66*    (2006.01)
  *H01R 13/717*   (2006.01)
  *H05K 1/02*     (2006.01)
  *G09F 9/302*    (2006.01)

(52) U.S. Cl.
  CPC .............. *H01R 33/02* (2013.01); *H01R 33/88* (2013.01); *H01R 33/92* (2013.01); *H05K 1/029* (2013.01); *G09F 9/302* (2013.01); *H05K 2201/10106* (2013.01)

(58) Field of Classification Search
  USPC .......... 439/573, 540.1, 564, 717, 541.5, 676
  See application file for complete search history.

(56) References Cited

U.S. PATENT DOCUMENTS

| | | | |
|---|---|---|---|
| 9,374,909 B2* | 6/2016 | Chae | ........................ H05K 3/32 |
| 2005/0239342 A1 | 10/2005 | Moriyama et al. | |
| 2008/0220631 A1 | 9/2008 | Isoda et al. | |
| 2013/0163234 A1 | 6/2013 | Hsien et al. | |

OTHER PUBLICATIONS

Translation of the International Preliminary Report on Patentability for International application PCT/DE2017/000241, originally dated Jul. 11, 2018.

* cited by examiner

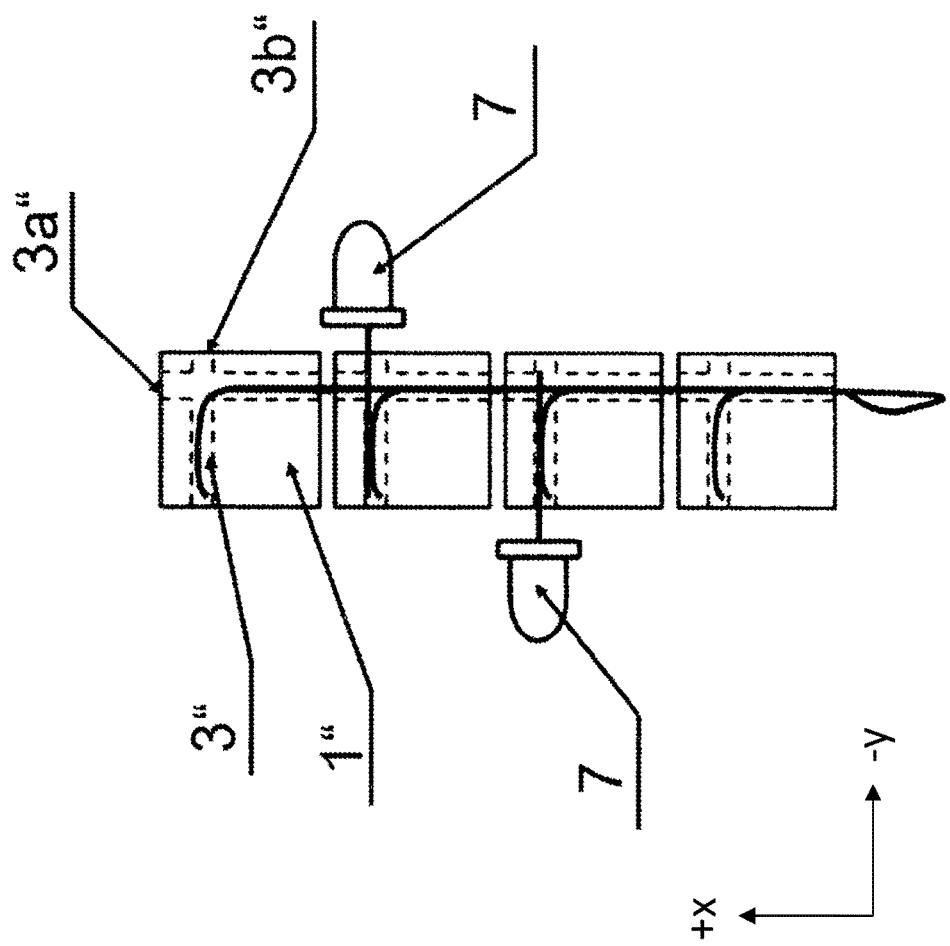

PLUG-IN MODULES AND PLUG-IN MODULE SYSTEMS

CROSS-REFERENCE TO RELATED APPLICATIONS

This application is a 371 National Phase Application of International Application No. PCT/DE2017/000241, filed on Aug. 1, 2017, which claims priority to and the benefit of DE 202016004792.3, filed on Aug. 4, 2016. The disclosures of the above applications are incorporated herein by reference.

FIELD

The present disclosure relates to a reusable plug-in module circuit board comprising a plurality of plug-in modules which can be connected in a plug-in module system and have light-emitting diodes which can be retrofitted, eg for constructing a decorative LED arrangement.

BACKGROUND

The statements in this section merely provide background information related to the present disclosure and may not constitute prior art.

In conventional plug-in module circuit boards, the light-emitting diodes (LED's) to be used are fixedly connected.

The plug-in modules have a large number of permanently connected LEDs. It is known to construct light-emitting diode plug-in modules in the form of a light-emitting diode matrix made of individual square plate-like segments of 4.5 cm×4.5 cm, each of which has nine light-emitting diodes which are operated with 12 volts at 1.8 watts. A matrix segment reaches up to 160 lm and a module efficiency of almost 90 lm/W. The matrix can theoretically be seamlessly combined into infinite strands, surfaces or complex shapes, without soldering or tinkering. The matrix can be ordered in prefabricated segment sizes, but can also be enlarged and reduced by hand according to the customer's own wishes. The electrical connection of the individual matrix segments is carried out for all light-emitting diodes of the segment together via a small laterally attachable contact block with two connecting cables. Thus, all nine light-emitting diodes of a voltage-applied matrix segment light up simultaneously. Such a light-emitting diode matrix is available from LUMITRONIX LED-Technik GmbH, 72379 Hechingen. However, any form of light-emitting diode decoration, for example in a heart-shaped contour, is not always possible with these matrix segments.

In conventional simple circuit boards, the individual light-emitting diodes must be soldered in accordance with the desired shape of the light string on grid-shaped distributed over the board surface factory-provided connection points. Corresponding electrical connections are made on the individual circuit boards by connecting cables to be soldered.

The creation of complex, especially three-dimensional shapes is not possible. Furthermore, the creation of a light-emitting diode decoration, e.g. in heart-shaped contour, is extremely complex.

SUMMARY

A system according to the present disclosure is intended to enable the construction of different types of light-emitting diodes (LEDs) decorations composed of plug-in modules without soldering and this also in different size and shape of the plug-in module system or the plug-in modules of the plug-in module circuit board in one-, two- and three-dimensional manner.

The plug-in modules comprise a plurality of segment-like plug-in modules which can be joined to a plug-in module circuit board with electrical contacts for the assembly and the voltage connection of the LEDs on the circuit board surface. The LEDs can thus be plugged individually with their own diode legs on contacts designed as latching and plug-in devices and supplied with voltage by a common positive or negative electrical connection of the plug-in modules connected in columns.

A plug-in module circuit board according to the teachings of the present disclosure includes a plurality of plug-in modules attached to each other side-by-side in a lateral longitudinal row. Each of the plurality of plug-in-modules comprise an electrical contact housing such that a plurality of side-by-side electrical contact housings in the lateral longitudinal row are formed. Each of the electrical contact housings has at least one outer surface with a latching structure comprising a recess extending horizontally and/or vertical and a rib extending horizontal and/or vertical such that a rib of one of the electrical contact housings is positioned within the recess of an adjacent electrical contact housing to attach the plurality of side-by-side electrical contact housings in the lateral longitudinal row to each other. Each of the electrical contact housings also has a pair of upper guide bores and each of the upper guide bores has an electrical contact and locking device for locking a connecting leg of a light emitting diode to the electrical contact housing and in communication with the electric contact. Each of the electrical contact housings also has a common electrical voltage connection in communication with each of the electrical contacts of the pair of upper guide bores such that each of the electrical contacts of the pair of upper guide bores has a common electrical voltage provided by the common electrical connection. One connecting leg of the light emitting diode can be locked in one electrical contact housing and another connecting leg can be locked in an adjacent electrical contact housing such that each leg has a different polarity voltage applied.

In some aspects of the present disclosure, the plug-in module circuit board further includes another plurality of plug-in modules attached to each other front-to-end in a perpendicular column, i.e., in a column that is perpendicular to the lateral longitudinal row of plug-in modules. Each of the another plurality of plug-in modules have the least one outer surface with a latching structure, the pair of upper guide bores with the electrical contact and the locking device, and the common electrical voltage connection in communication with each of the electrical contacts of the pair of upper guide bores. Also, each of the plug-in-modules in the perpendicular column have the same common electrical voltage. In some aspects of the present disclosure, the another plurality of plug-in modules comprise at least two perpendicular columns positioned adjacent each other and adjacent perpendicular columns have an opposite electrical voltage from each other.

In some aspects of the present disclosure, each of the electrical contact housings comprise a single wide opening for supporting the common electrical voltage connection. In such aspects, the single wide opening for supporting the common electrical voltage connection can extend 90° to each of the upper guide bores.

In some aspects of the present disclosure, the upper guide bores are positioned in a rear region the electric contact housing. In such aspects, a single wide opening can extend from a front region of the electric contact housing towards a rear region of the electric contact housing.

In some aspects of the present disclosure, a contact spring strip with an arcuate section, e.g., a 90° bent section, extends between the common electrical voltage connection and the electric contacts of the upper guide bores. In such aspects, the contact spring strip can protrude from the single wide opening and bend approximately 360° to form the common electrical voltage connection.

In some aspects of the present disclosure, the plug-in module circuit board includes elongated profiled connecting rods with longitudinal ribs and longitudinal recesses positioned between adjacent electrical contact housings such that the plurality of side-by-side electrical contact housings form a curved upper surface. Also, individual connections between the electrical contacts in the upper guide bores and common electrical voltage connection can be formed by wire or cross-section sleeve-shaped connecting parts which are bent with a radius towards each other.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 6:
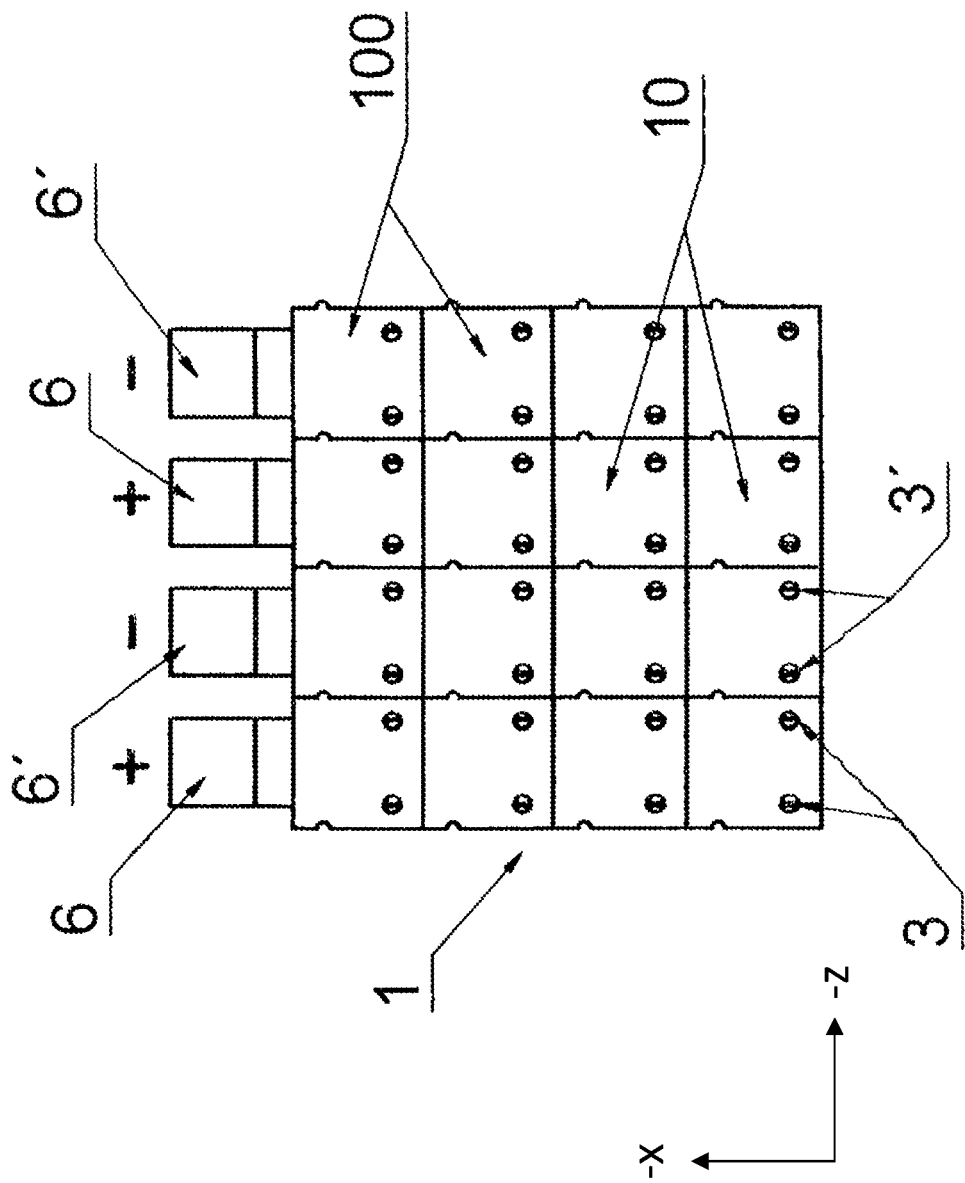

FIG. 6 is a plan view of a plug-in module circuit board formed from four plug-in modules, laterally arranged in a horizontal row (+z direction) and connected via a latching structure, which additionally are plugged in four perpendicular columns (+x direction) including four plug-in modules one behind the other and thus consist of 16 plug-in modules. The connection is made in each case with a forwardly projecting end section of the contact spring strip used also for voltage contact-making.

Figure 7:
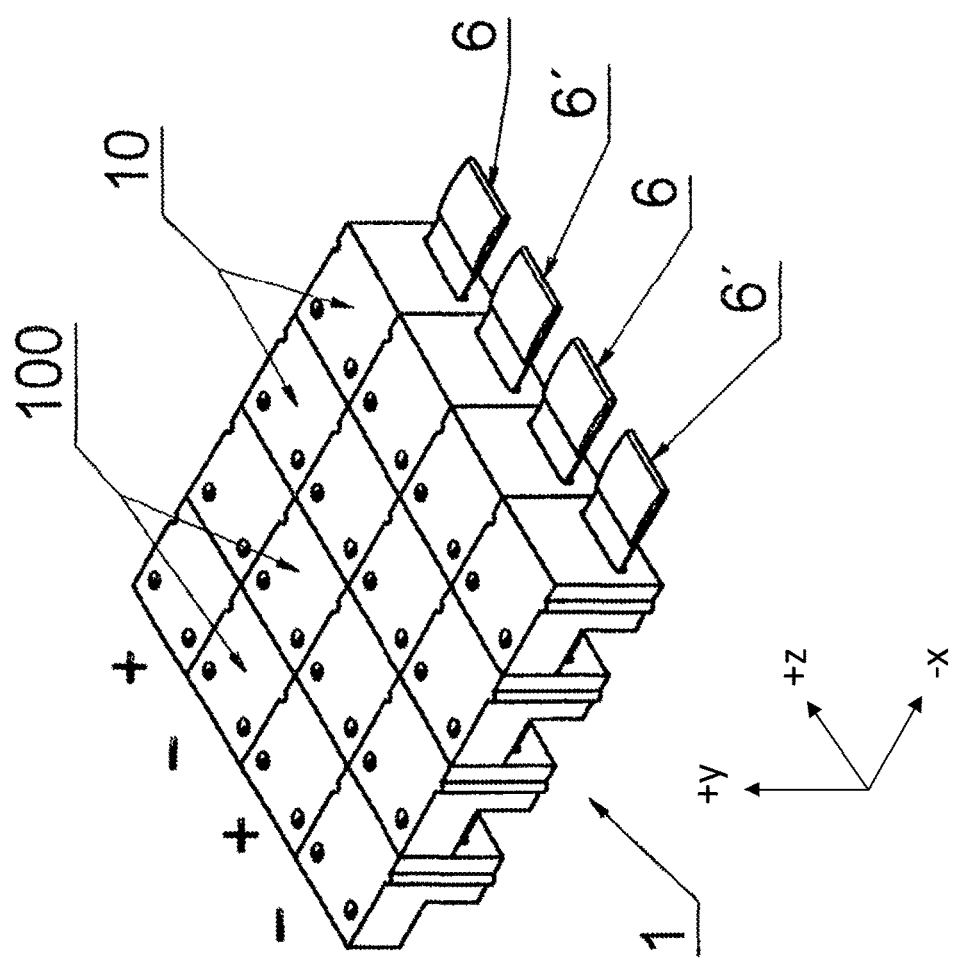

FIG. 7 shows a perspective view of the 16 plug-in modules which are plugged-in according to FIG. 6.

Figure 8:
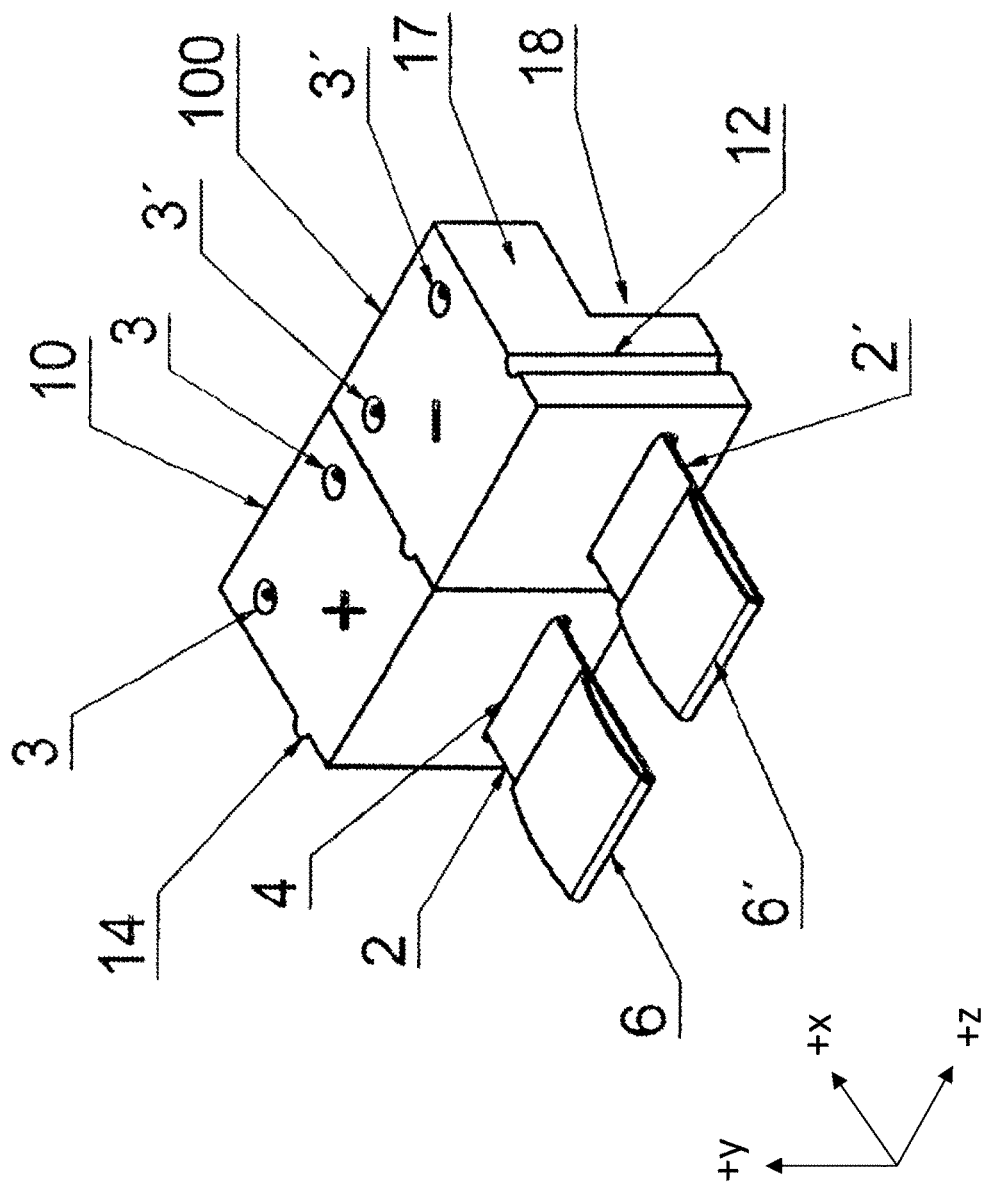

FIG. 8 is a perspective view of two laterally connected electrical contact means housings, which are connected to each other via a vertical recess and a vertical grid rib, lying on the opposite outside, each with contact spring strips and a projecting lower end section thereof.

Figure 9:
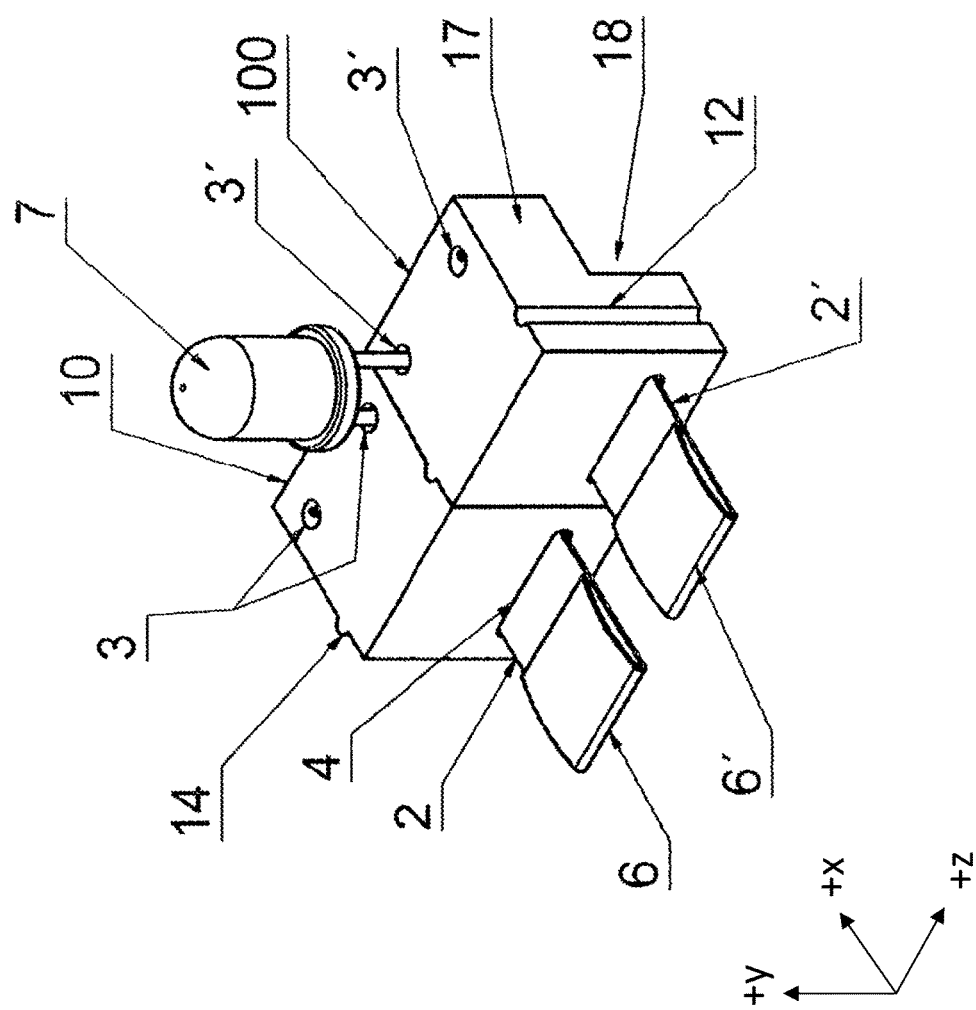

FIG. 9 shows a representation according to FIG. 8 with connected light-emitting diode, wherein in each case a diode leg is inserted into the adjacent contact-making means of the two interconnected electrical contact means housings and can be connected to a voltage via the projecting end sections of the contact spring strips of this electrical contact means housings.

Figure 10:
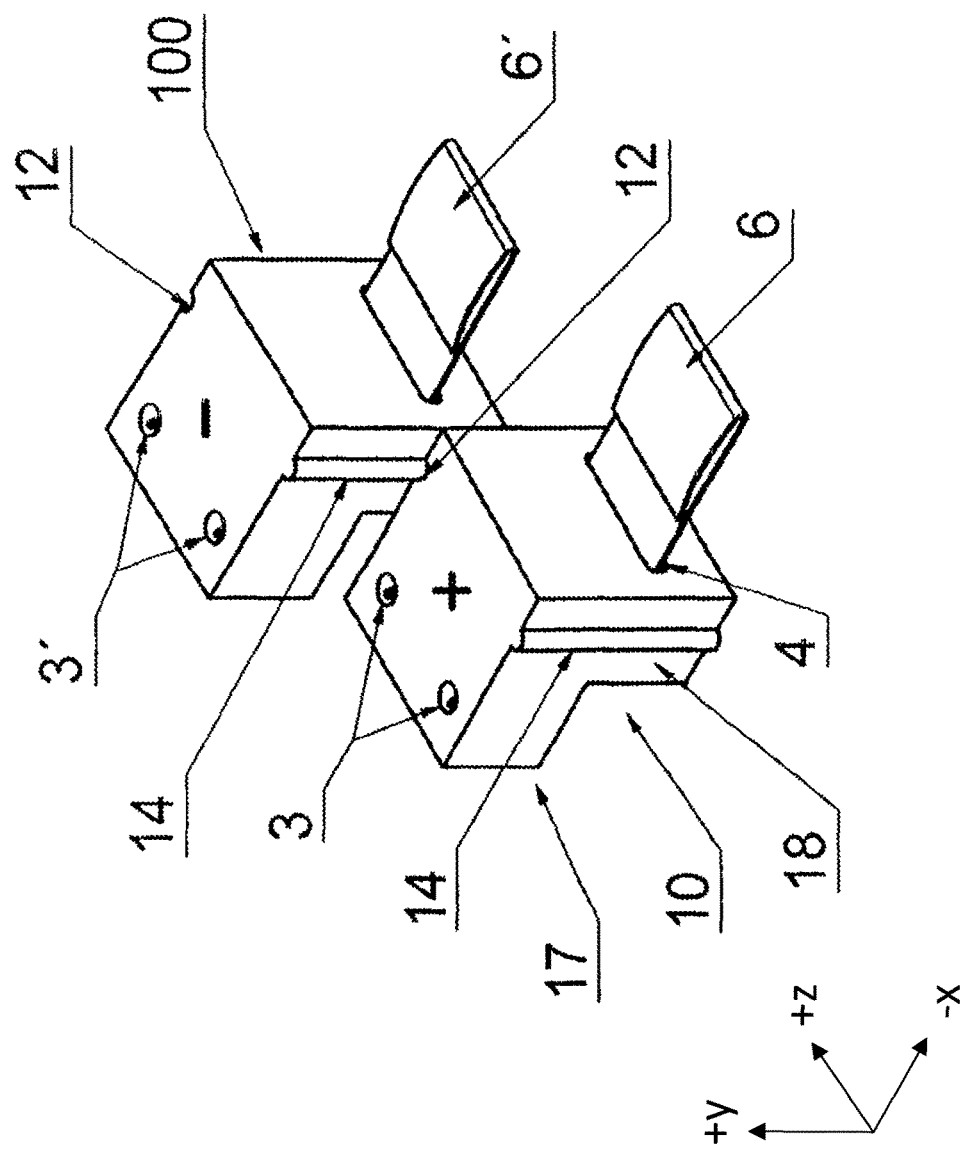

FIG. 10 shows an illustration according to FIG. 9 via an electrical contact means housing connected to each other on the outside, which, in contrast to FIG. 9, are laterally interconnected at different heights.

Figure 11:
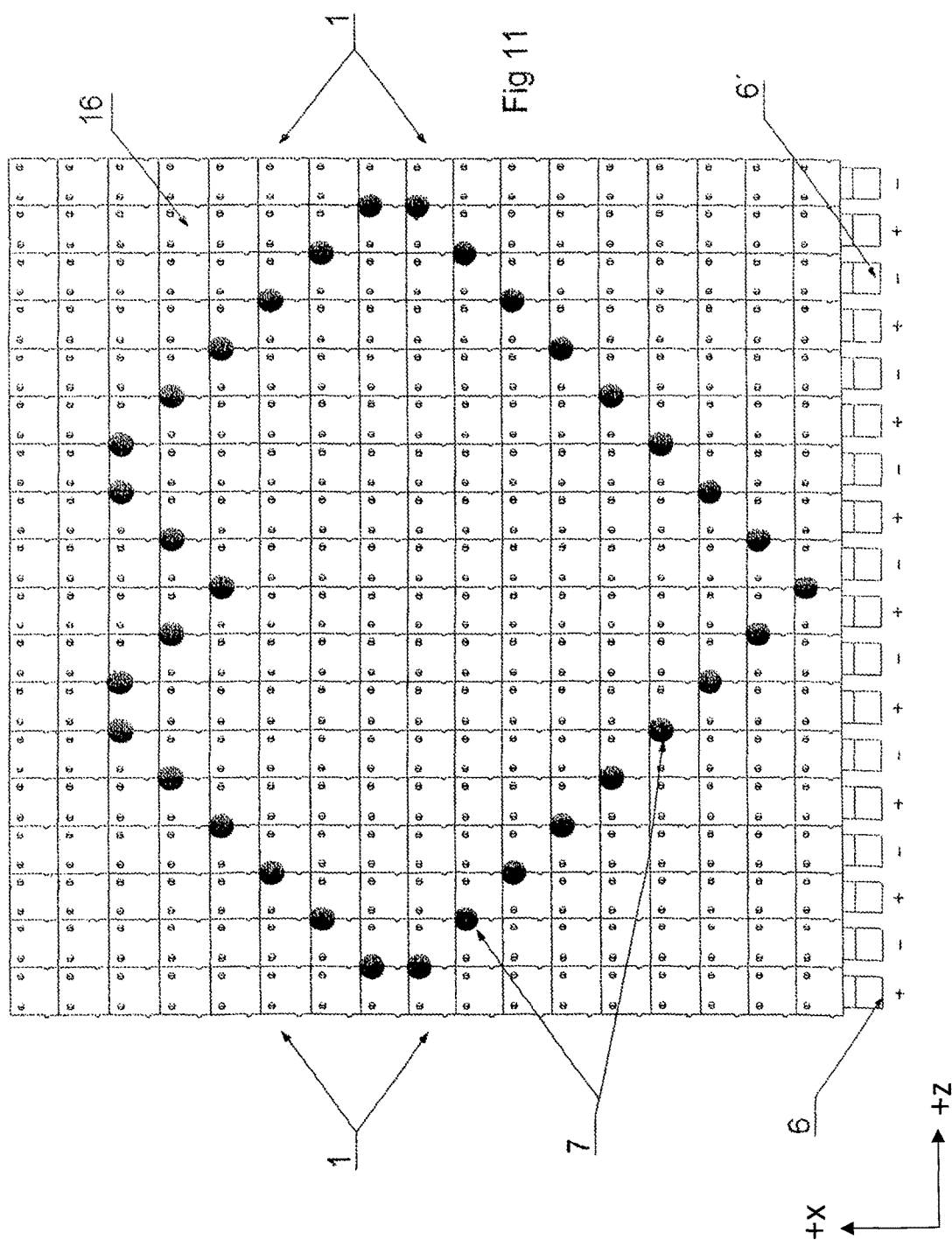

FIG. 11 shows an arrangement of plug-in modules arranged in a square matrix of a plug-in module circuit board, wherein respectively 18 plug-in modules are arranged in a horizontal rows (+z direction) and 17 plug-in modules arranged in perpendicular columns (+x direction), the light-emitting diodes are placed under representation of a heart-shaped outline in the contact-making means provided at the top of the electrical contact means housings.

Figure 12:
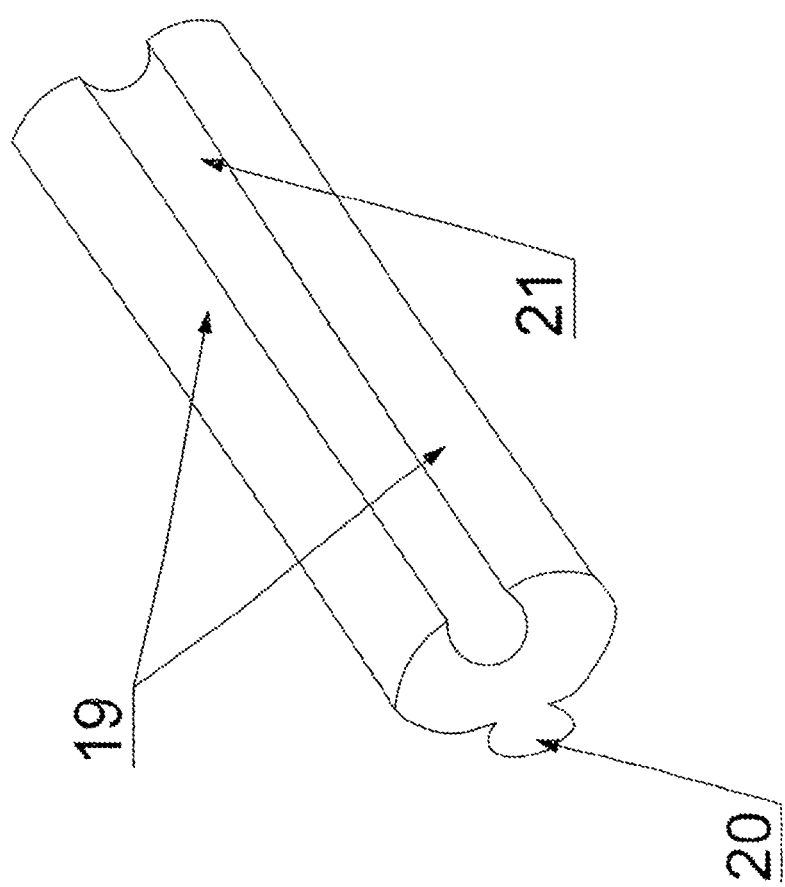

FIG. 12 shows a connecting rod in a perspective view for the spacing of the electrical contact means housings of two plug-in modules to be connected laterally with longitudinal rib and longitudinal recess, which fit into the latching structure of longitudinal recesses and grid ribs on the outer sides of the electrical contact means housings.

Figure 13:
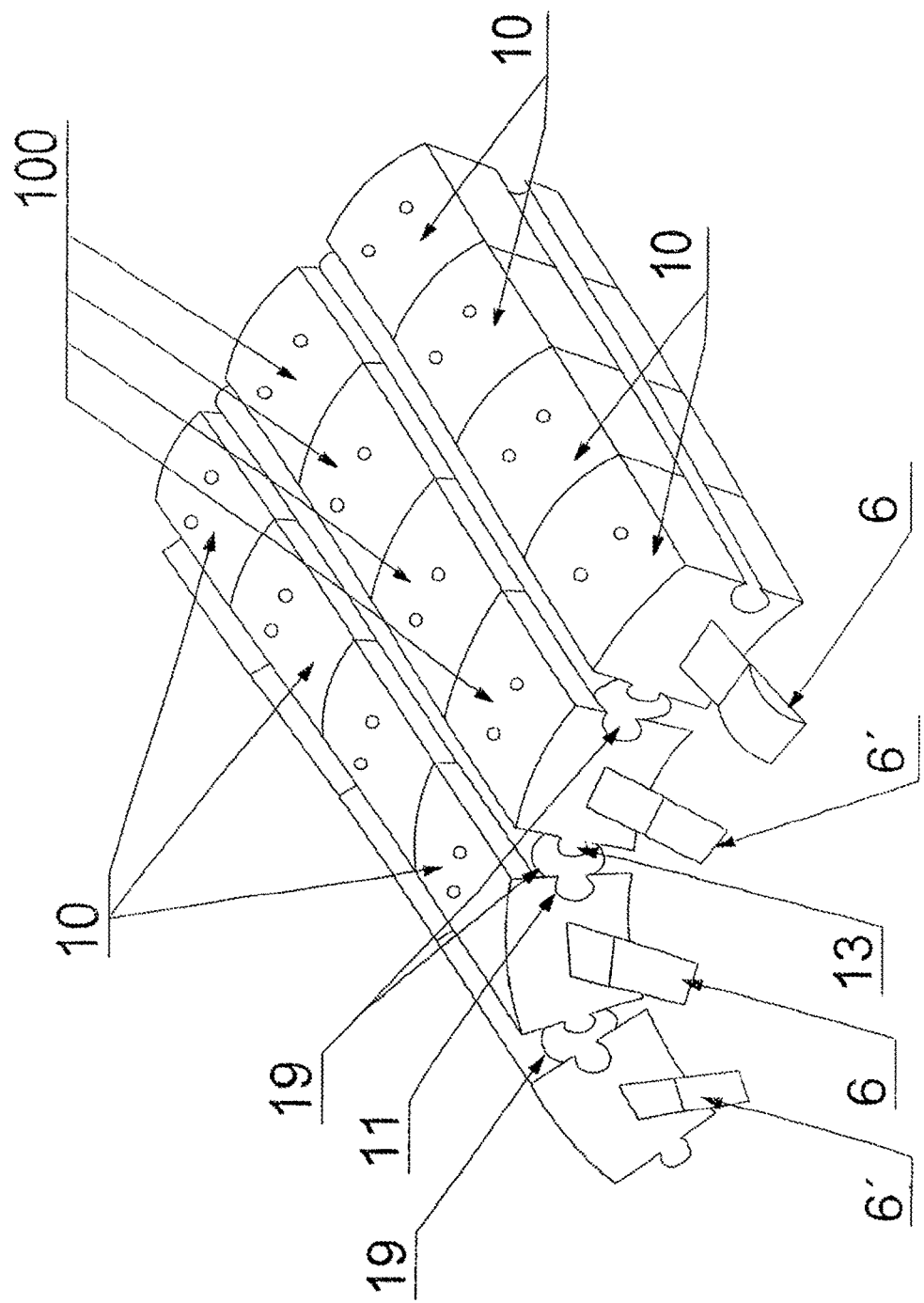

FIG. 13 shows a plug-in module circuit board formed with a curved surface using the connecting rods according to FIG. 12, wherein the individual plug-in modules, arranged laterally to one another are provided against each other at an angle, in accordance with the grid ribs and longitudinal recesses of the connecting rod, which are provided at an angle.

Figure 14:
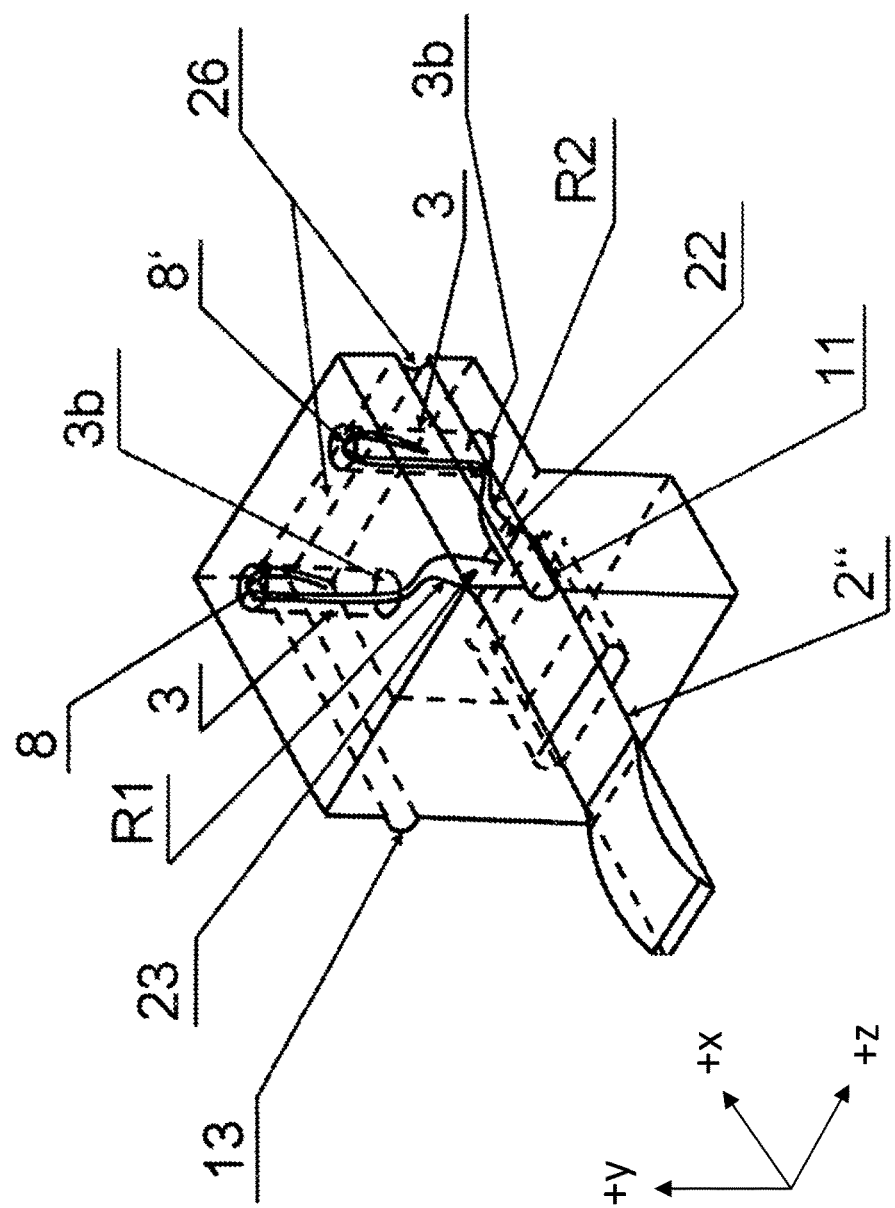

FIG. 14, 15 shows two plug-in modules modified with respect to their contact spring strips.

Figure 16:
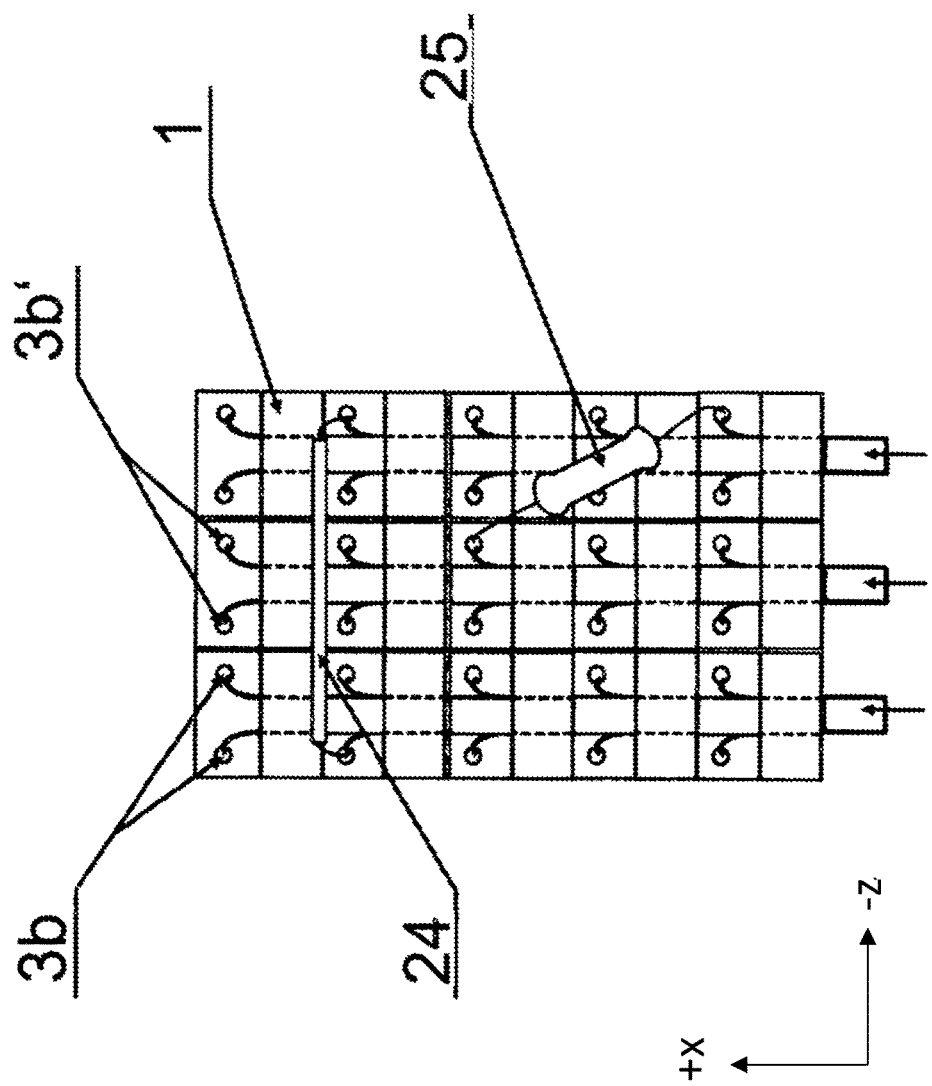

FIG. 16 shows the rear side of a plug-in module circuit board consisting of five horizontal rows and three perpendicular columns with a plugged-in resistor'.

Figure 17:
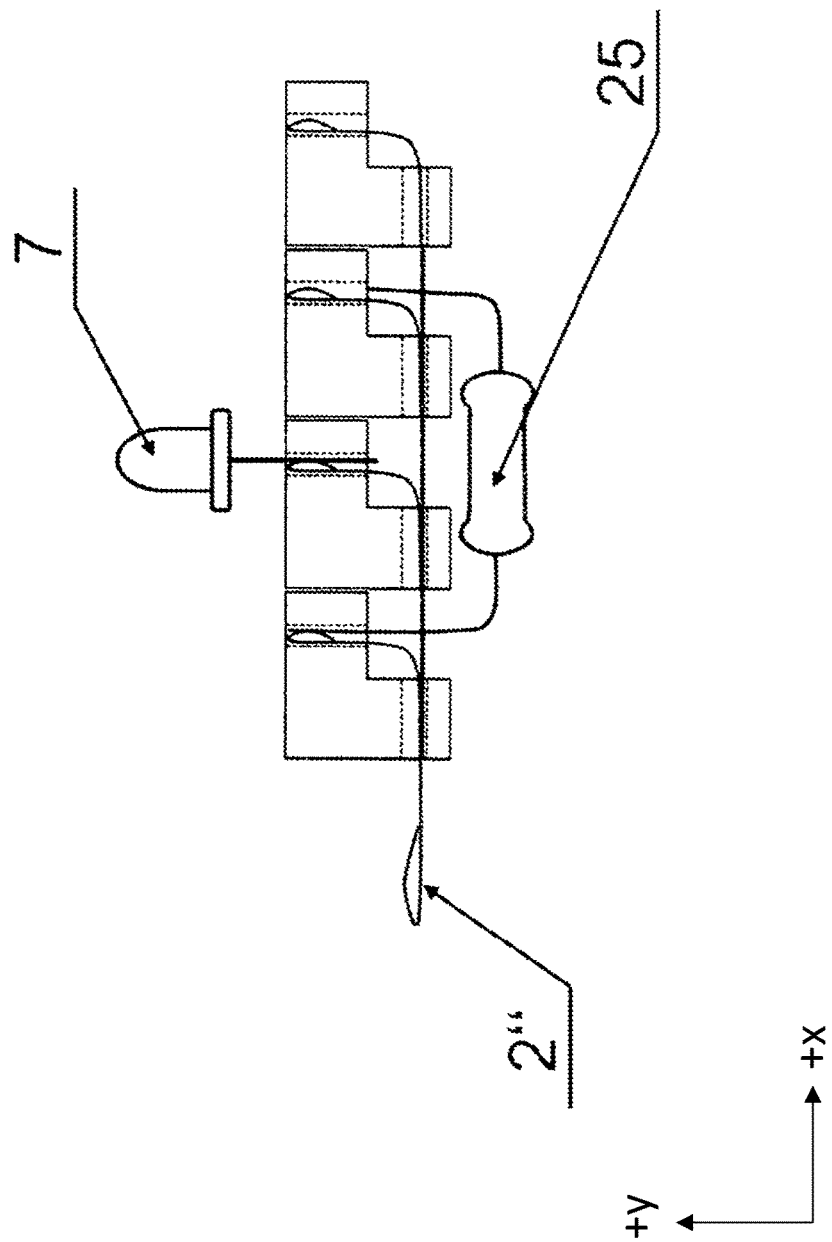

FIG. 17 shows a side view of the plug-in module circuit board in FIG. 16.

Figure 18:
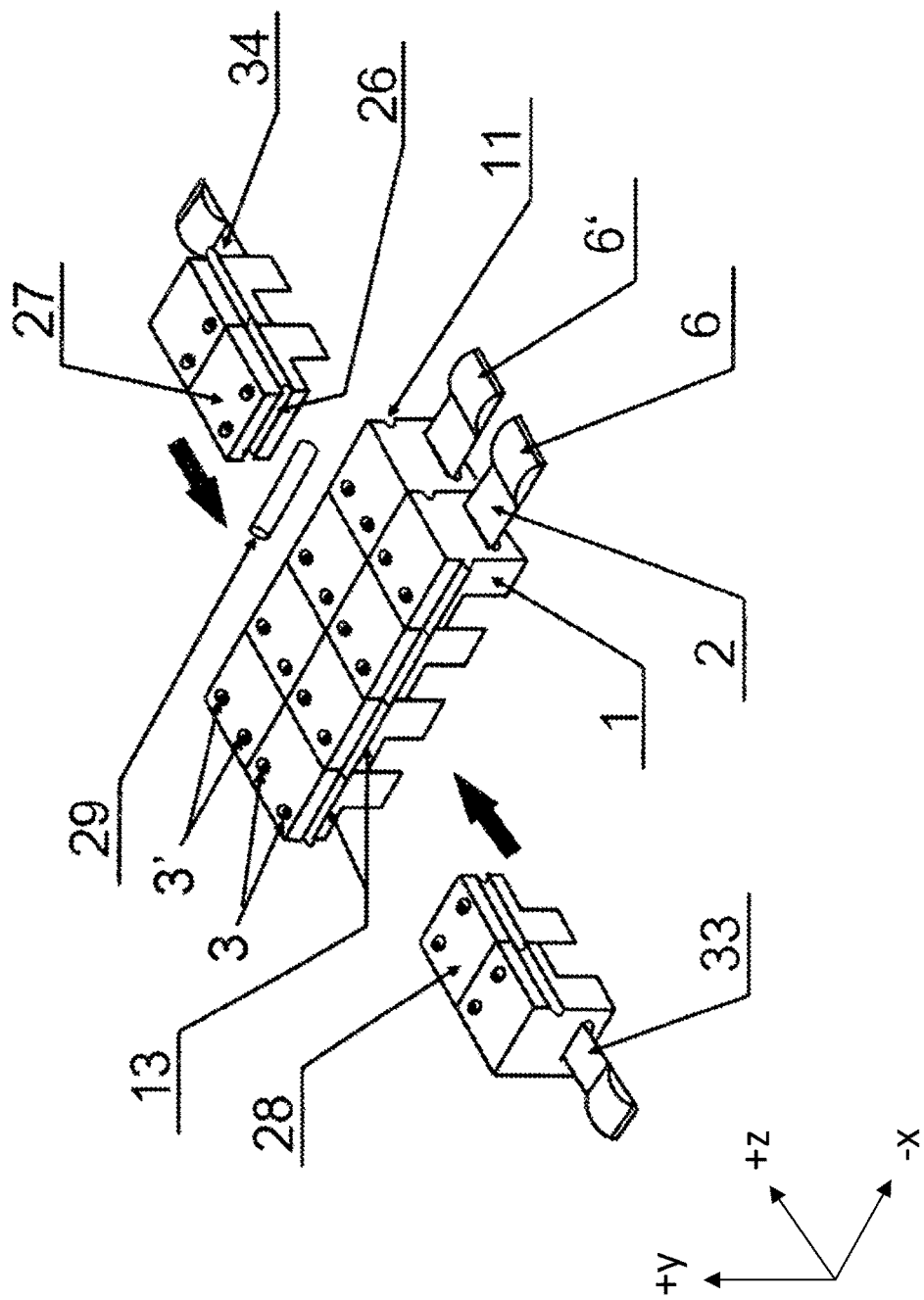

FIG. 18 shows in the middle a bigger plug-in module circuit board consisting out of two rows of plug-in modules with a lateral concave or convex horizontal latching structure to which there are to be connected respectively two outer plug-in modules on the left and right side connected together and turned both to the modules of the rows by 90° having an appropriate horizontal concave latching structure at their rear side.

Figure 19:
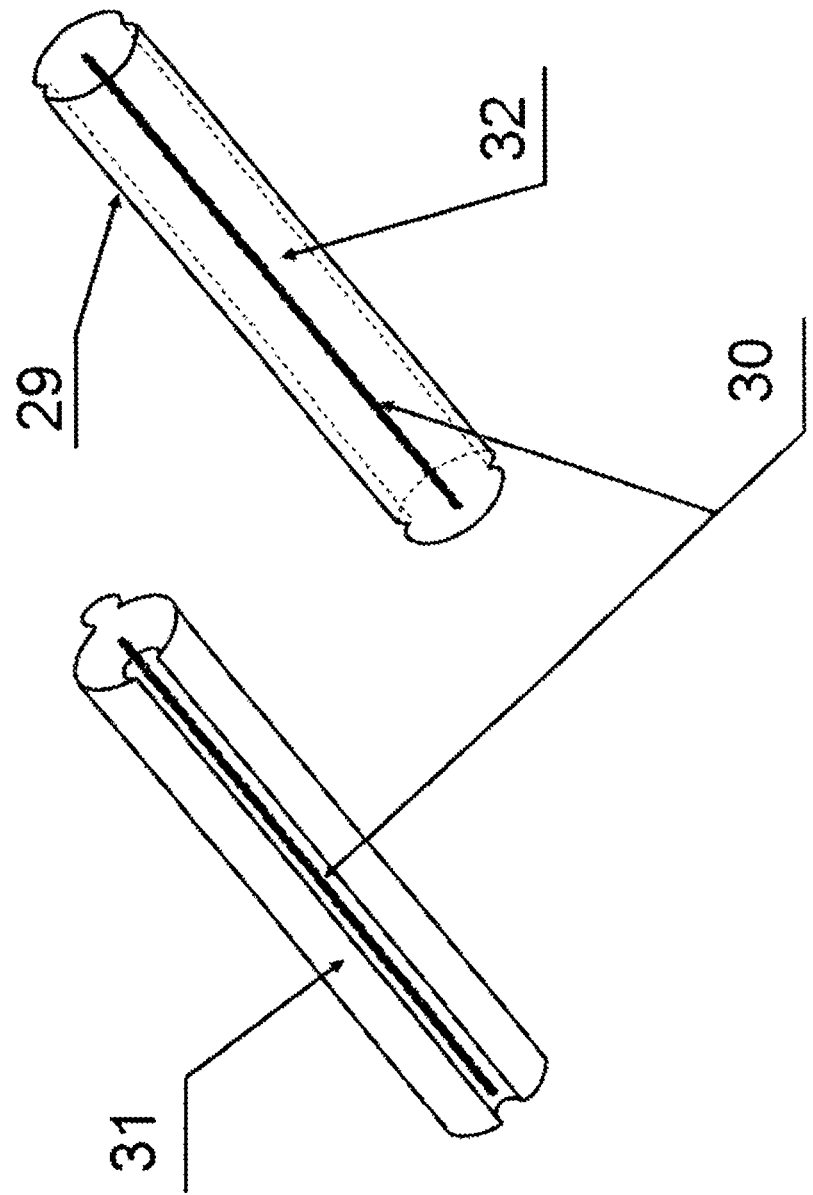

FIG. 19 shows two connecting rods used to connect these plug-in modules to those of the rows.

Figure 20:
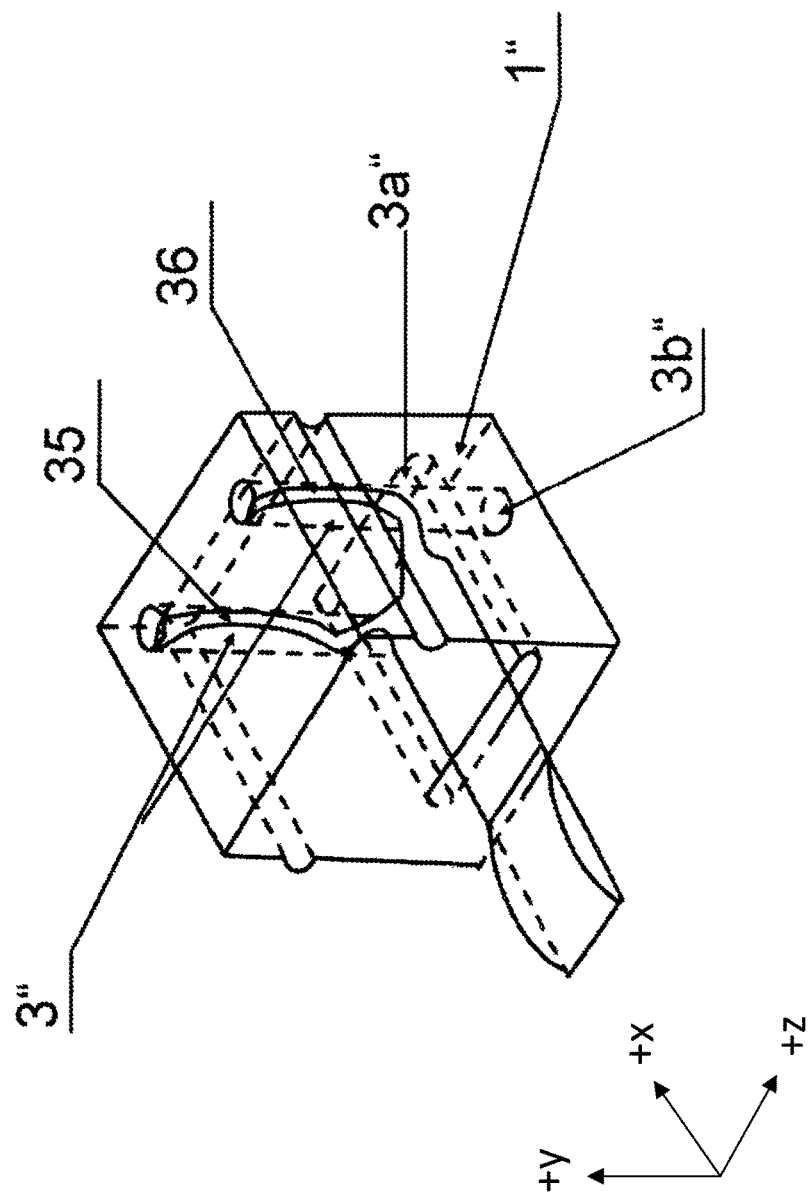

FIG. 20 shows an alternative electrical contact means housing of a plug-in module.

FIG. 21 shows the side view of a one-dimensional plug-in module system made of these alternative electrical contact means housings with two LEDs.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Referring now to FIGS. 1-4, an electrical contact housing (1') for plug-in modules (10, 100) may be formed from a variety of materials, for example hard plastic or soft silicone.

The size of a plug-in module circuit board (1) according to the teachings of the present disclosure and from an assembly of individual plug-in modules (10, 100) can be varied according to the number of plug-in modules (10, 100) used which can be connected to each other. The matrix-like plug-in modules (10, 100), which can be connected together comprise one laterally projecting contact spring strip (2, 2'), with one end section (6), fitted with two upper (+y direction) contacts (8, 8') for the light-emitting diodes (7) and for the electrical contact housing (1') to receive said diodes. They allow a clean light-emitting diode decorative arrangement on the top (+y direction) side, since the light emitting diodes (7) are each connected with a diode leg on laterally adjacent positive and negative contacts (8, 8'), thus formed using jumpers of the light-emitting diodes. Also, other connections can be plugged-in with each other on the front (−x direction) and back (+x direction) and the outside boundaries of the plug-in modules (10, 100).

The plug-in module system can be reused several times after removal of the light-emitting diodes (7) and after disassembly of the plug-in modules (10, 100) connected to the plug-in module circuit board (1) and whereas the plug-in modules (10, 100) can be re-assembled.

Figure 1:
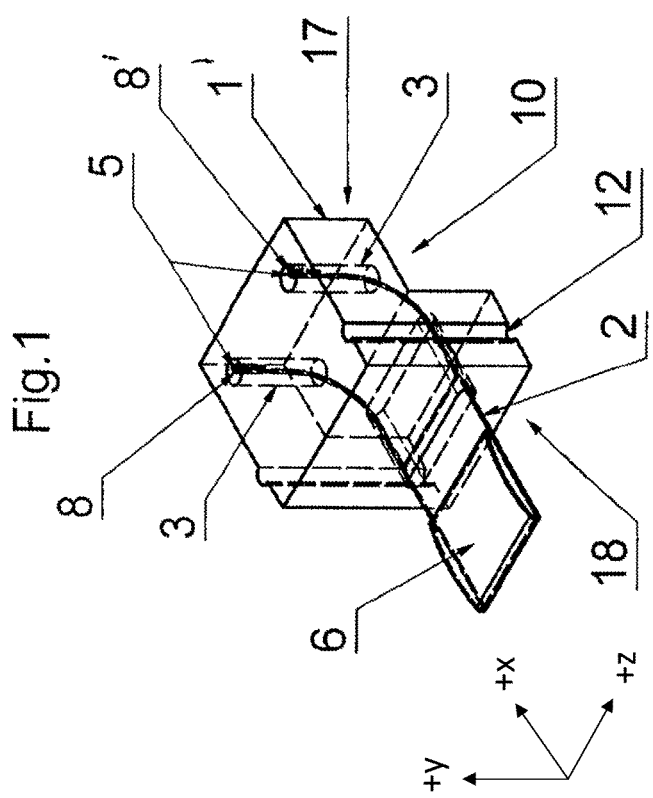
FIG. 1 is a side view of a plug-in module out of an electrical contact means housing with contact spring strips and two upper contact-making means for the diode legs of the light-emitting diodes to be connected according to FIG. 9.
Figure 2:
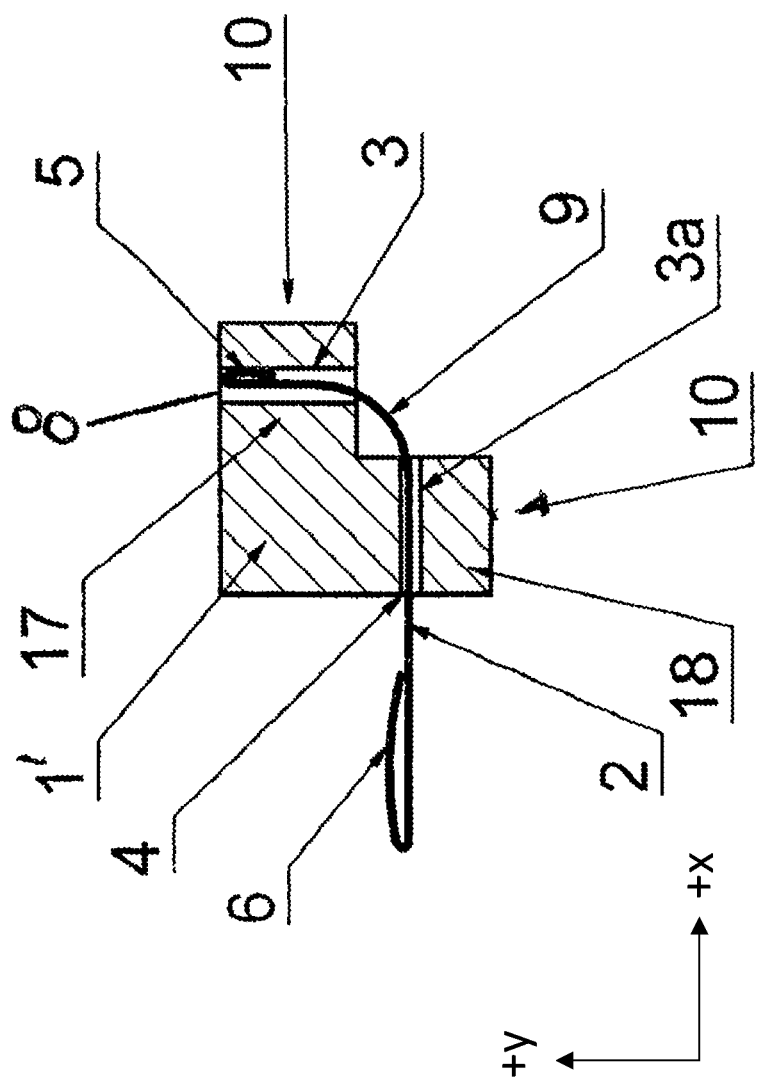
FIG. 2 shows a cross-sectional view through the plug-in module with electrical contact means housing according to FIG. 1 along one of the two upper guide bores and the lower wider guide bore for laying-out the contact-making means or the contact spring strip.
Figure 3:
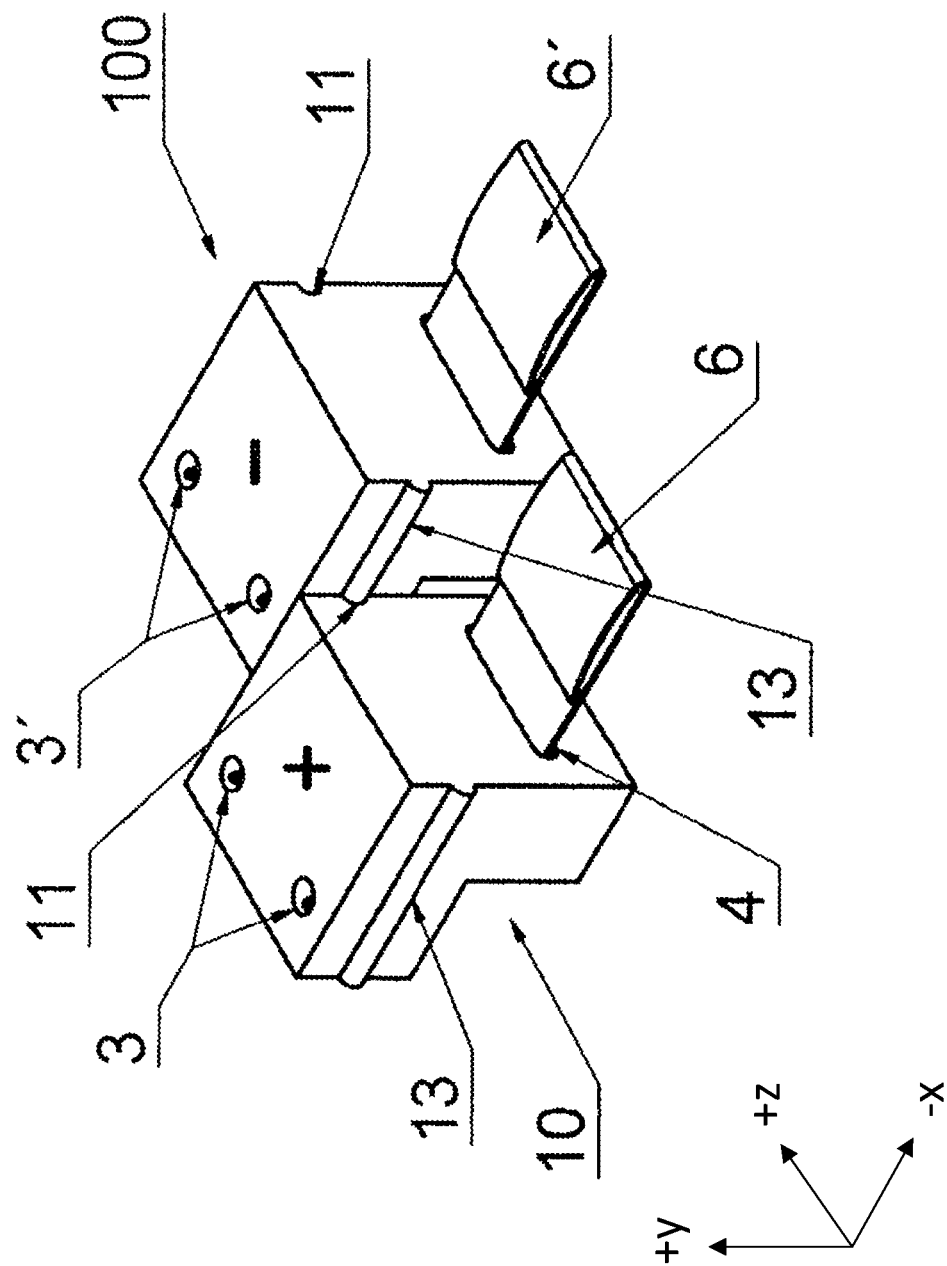
FIG. 3 shows two lateral electrical contact means housings, connected via horizontal grid ribs and longitudinal recesses, shifted with respect to one another, each with illustrated front lower end portion of the contact spring strips, in perspective view.

As noted above, the plug-in modules (10, 100) include two parts, as represented for example on FIGS. 1, 2 and 3, namely the electrical contact housing (1') and a respective contact spring strip (2, 2') with contacts (8, 8') arranged thereon.

A contact spring strip (2) with two upper (+y direction) sections is mounted respectively in the upper guide bores (3, 3') guided from the rear (+x direction) housing top (+y direction) side to the underside (−y direction) of the plug-in modules in the electrical contact housing (1'). These connections are guided via a lower (−y direction) wider guide bore (3a) as a common section to a single wide opening (4) and thus installed therein with the common section.

Figure 5:
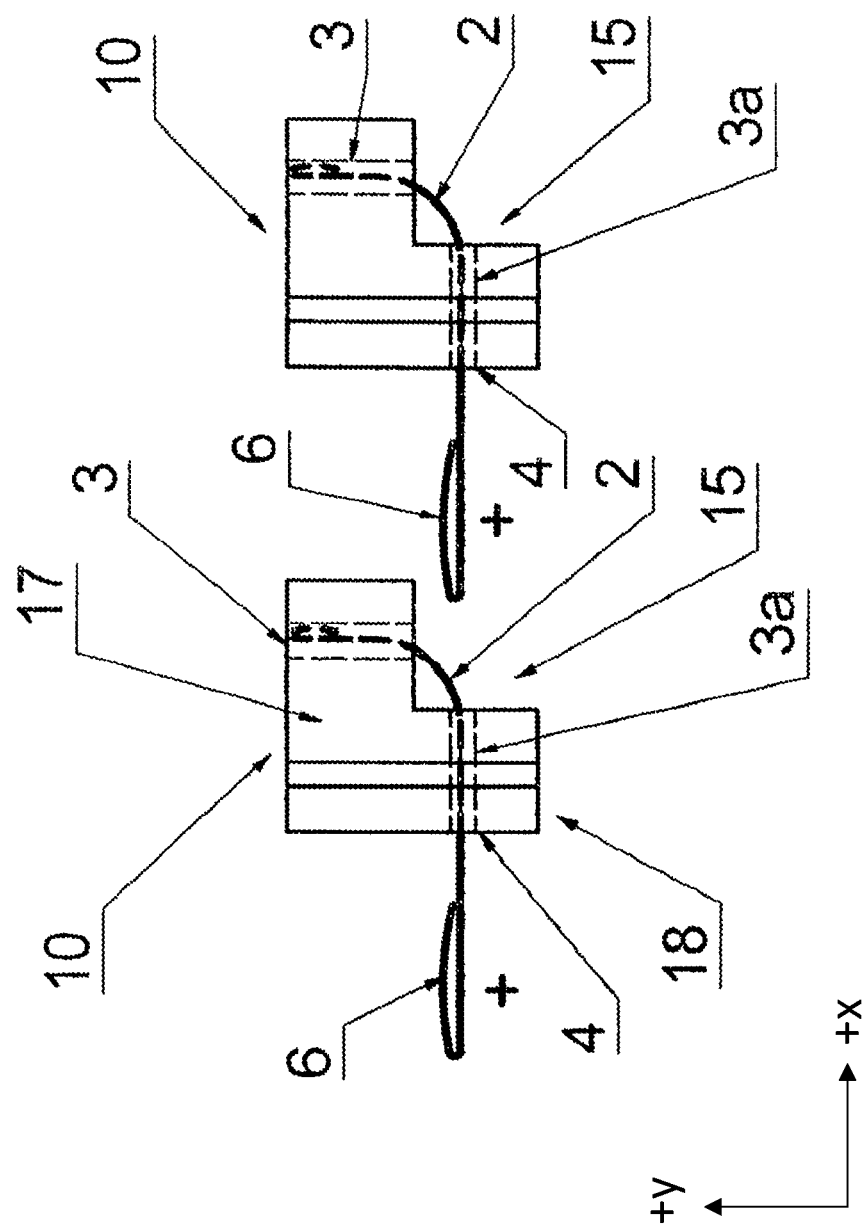
FIG. 5 is a view according to FIG. 2 in side view instead of cross section showing two plug-in modules, initially spaced, in a column after one another to be plugged, with an opening in the lower guide bore for serving as latching and plug-in front end portion of the contact spring strip of the rear plug-in module.

The two upper ends (5) of the contact spring strip (2, 2') are bent with the lower end section (6) semicircular to each other so that the plug-in modules of the same polarity can be fixedly connected by the contact spring strips (2, 2') to be mated (FIG. 5).

Figure 4:
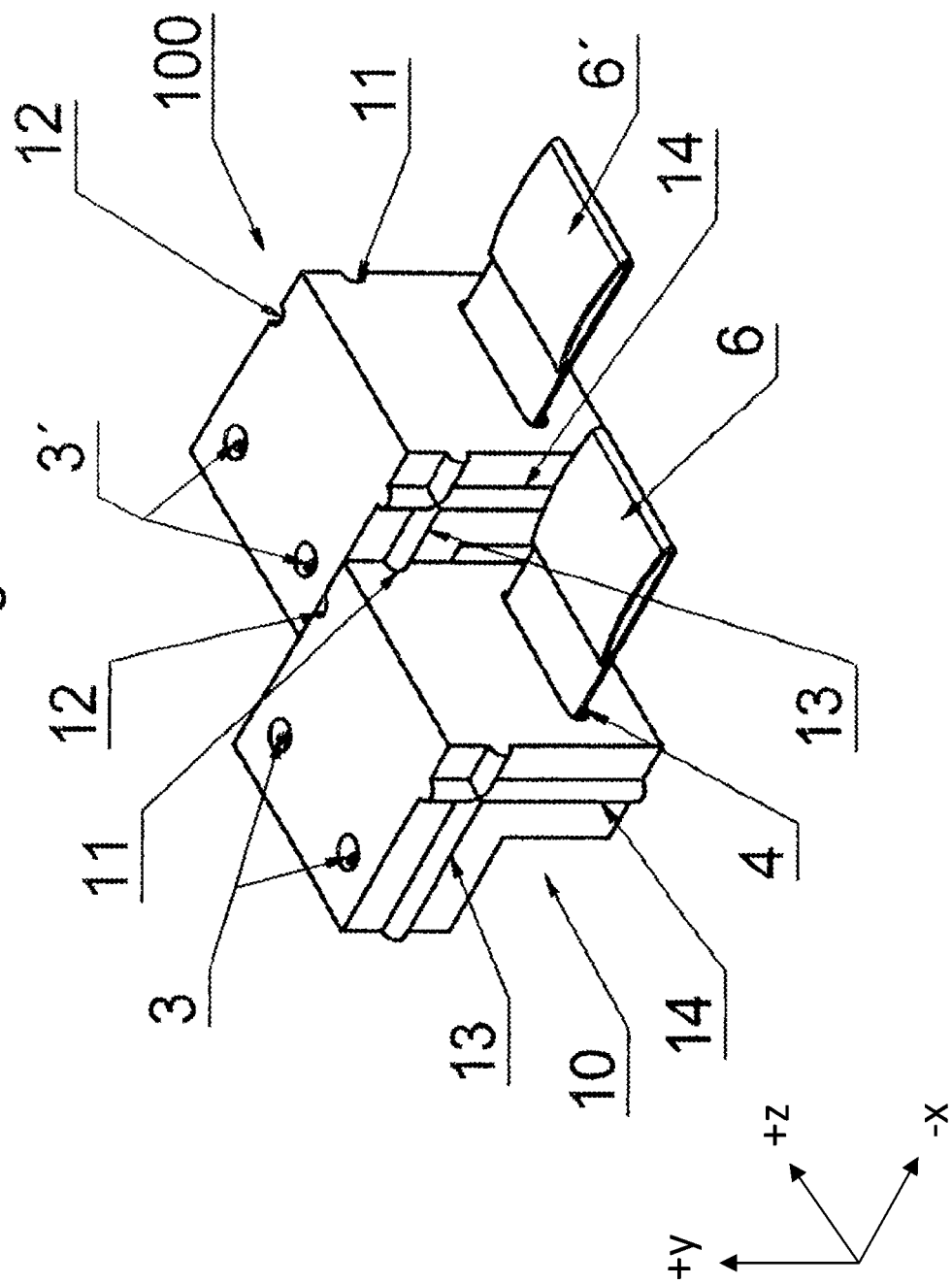
FIG. 4 shows a modification of the electrical contact means housing by representing a locking structure on the outer sides of both horizontal and vertical longitudinal recesses and grid ribs.

The two right (+z direction) and left (−z direction) outer sides of the electrical contact housing (1') are constructed with a latching structure as well as longitudinal recesses (11, 12) extending horizontally (x-axis) and vertically (y-axis) and also horizontal and vertical locking ribs (13, 14) projecting laterally, so that the plug-in modules can be connected in a plane next to one another and at different heights (FIG. 4). Thus, the plug-in modules (10, 100) can be connected side by side (z-direction) and at different heights (y-direction). Alternatively, according to FIG. 3, only a latching structure is created, running in the horizontal direction.

A round, concave and convex structure of the two outer sides of the electrical contact housing (1') allows to accommodate a curved variable connection surface of the two electrical contact housings with positive or negative polarity, under the electrical contact housing (1') of two adjacent plug-in modules (10, 100).

The plug-in modules (10) of the same polarity can be plugged-in successively in a row (x-direction) in accordance with FIG. 5 by a semicircular like shaped parts of the contact spring strips (2), which are semicircular curved and projecting in an upper (+y direction) and in a lower (−y direction) wider longitudinal bore. According to FIG. 5, the plug-in connection of plug-in modules (10) with positive polarity is shown. These plug-in modules (10) successively arranged for connection form a common conductor strip.

In this case, the end section (6) of the rear (+x direction) plug-in module (10), which is at the lower (−y direction) end of the contact spring strip (2), is plugged into the wide opening (4) of the lower guide bore (3a) at the outlet (15) of the connection housing of the front (−x direction) plug-in module (10), i.e. with the bent contact spring strip (2) extending into a semi-circle.

A heart decoration with plugged-in light-emitting diodes according to FIG. 11 is schematically depicted.

Figure 15:
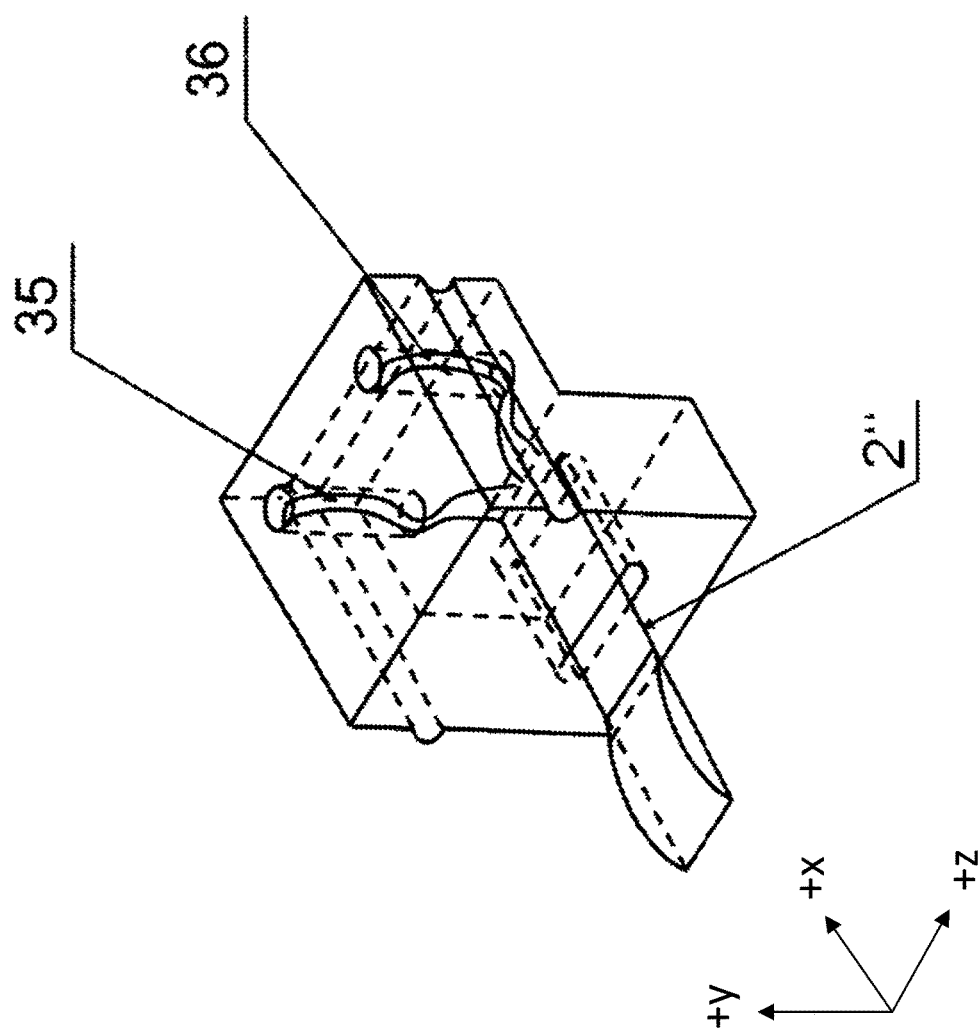

Variations of the plug-in modules are shown in FIGS. 14-18. For example, FIGS. 14 and 15 show two plug-in modules with modifications of the contact spring strips.

In these plug-in modules, the electrical connections between the two upper (+y direction) contacts (8, 8') are not formed as a wire, in the upper two guide bores (3, 3') and the contact strip (2") in the lower wide guide bore shown in cross-sectional view in FIGS. 2 and 6, but are bent towards each other inwardly with a radius (R1; R2) as cut neck-shaped or plate-shaped electrical connection contacts (22, 23) seen in cross-section. Thus, a possible partial blockage of the lower (−y direction) sides of the two upper (+y direction) guide bores (3, 3') is avoided thanks to the sections of the inserted connecting contacts (22, 23) extending to the contact spring strip (2"). The region of the opening to the lower side of the two upper guide bores (3, 3') is designated by (3b). These bends are used for better connection of components necessary for an electrical circuit such as jumpers, resistors, etc., on the rear (+x direction) side of the plug-in modules of the plug-in module circuit board (1) i.e. on the opening of the lower (−y direction) side of the two upper (+y direction) guide bores (3, 3').

FIG. 15 shows a bent form (35, 36) of the contact spring strip (2") modified with respect to FIG. 14.

In both examples, as also shown in FIGS. 3 and 4, lateral concave or convex horizontal latching structures (11, 13) are present on the plug-in modules.

FIG. 16 shows the rear (+x direction) side of the plug-in module circuit board (1) with a plugged-in jumper (24) and a plugged-in resistor (25).

FIG. 17 shows the side view according to the drawing of FIG. 16 from the right (side).

In addition to the lateral concave or convex horizontal latching structure (11, 13) in FIG. 15 and FIGS. 3, 4, FIGS. 14 and 18 show a concave horizontal latching structure (26) on the back (+x direction) of the plug-in modules.

This latching structure (26) allows lateral connection of plug-in modules which are rotated by 90° vertically relative to the columns of plug-in modules connected to each other front-to-back (x direction).

FIG. 18 shows a column connection (i.e., front-to-back) of two outer plug-in modules on the left side of the plug-in module circuit board (1). An additional connecting rod (29) is required due to the two opposite horizontal concave latching structures, for connection on the right outer side of the plug-in module circuit board (1).

FIG. 19 shows two different connecting rods (29) with a metal core (30), which are surrounded by a flexible sheath (31, 32).

The metal core supports in any flexible three-dimensional formations made of the plug-in modules, and the stability of the shape of the plug-in module board thus formed is provided.

FIG. 20 shows an alternative electrical contact housing (1"). This is modified, compared to the original electrical contact housing (1') (see FIG. 1) in such a way that the entire cube shape remains but that the two upper guide bores (3) extend as bores (3") to the lower side of this cube shape at a region (3b") and that the lower wide guide bore (3a) extends as bore (3a") to the back side of the cube shape.

This alternative connection housing (1") serves to form a free rear side of the plug-in module board, thus the LEDs can be plugged in both from the front side and from the rear side of the plug-in module.

This laterally dual plug-in system plays a very favorable role in the construction of three-dimensional LED decoration or lighting systems.

FIG. 21 shows a side view of a one-dimensional plug-in module system comprising these alternative connection housings, each having one of two LEDs on the front and rear side of the plug-in module board with the alternative electrical contact means housing (1").

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, manufacturing technology, and testing capability.

The description of the disclosure is merely exemplary in nature and, thus, variations that do not depart from the substance of the disclosure are intended to be within the scope of the disclosure. Such variations are not to be regarded as a departure from the spirit and scope of the disclosure. The terms "upper", "lower", "top", "bottom", "front", "back", "rear" and the like as used herein refer to positions, directions, orientations, etc., in the drawings unless stated otherwise and not should not be interpreted as exact or specific to positions, directions, orientations, etc., unless otherwise stated.

As used herein, the phrase at least one of A, B, and C should be construed to mean a logical (A OR B OR C), using a non-exclusive logical OR, and should not be construed to mean "at least one of A, at least one of B, and at least one of C.

The invention claimed is:

1. A plug-in module circuit board comprising:
   a plurality of plug-in modules attached to each other side-by-side in a lateral longitudinal row, wherein each of the plurality of plug-in-modules comprise an electrical contact housing forming a plurality of side-by-side electrical contact housings in the lateral longitudinal row, wherein each of the electrical contact housings has:
      at least one outer surface with a latching structure comprising a recess extending horizontally and/or vertical and a rib extending horizontal and/or vertical such that a rib of one of the electrical contact housings is positioned within the recess of an adjacent electrical contact housing to attach the plurality of side-by-side electrical contact housings in the lateral longitudinal row to each other;
      a pair of upper guide bores, wherein each of the upper guide bores has an electrical contact and locking device for locking a connecting leg of a light emitting diode to the electrical contact housing and in communication with the electric contact; and
      a common electrical voltage connection in communication with each of the electrical contacts of the pair of upper guide bores such that each of the electrical contacts of the pair of upper guide bores has a common electrical voltage provided by the common electrical connection;
   wherein one connecting leg of the light emitting diode is locked in one electrical contact housing and another connecting leg is locked in an adjacent electrical contact housing such that each leg has a different polarity voltage applied.

2. The plug-in module circuit board of claim 1, wherein the another plurality of plug-in modules comprise at least two perpendicular columns positioned adjacent each other and adjacent perpendicular columns have an opposite electrical voltage from each other.

3. The plug-in module circuit board according to claim 1 further comprising a contact spring strip with an arcuate section extending between the common electrical voltage connection and the electric contacts of the upper guide bores.

4. The plug-in module circuit board according to claim 1 further comprising elongated profiled connecting rods with longitudinal ribs and longitudinal recesses positioned between adjacent electrical contact housings such that the plurality of side-by-side electrical contact housings form a curved upper surface.

5. The plug-in module circuit board according to claim 1 further comprising at least one additional electrical contact housing having a rear region comprising a horizontal recess or a horizontal rib such that the horizontal recess or the horizontal rib is positioned on a horizontal rib or in a horizontal recess, respectively, of one of the electrical contact housings attached to each other side-by-side such that the rear region of the at least one additional electrical contact housing is attached to the plurality of plug-in modules attached to each other side-by-side.

6. The plug-in module circuit board according to claim 1, wherein at least one additional electrical contact housing has a rear region comprising a horizontal recess and one of the electrical contact housings attached to each other side-by-side comprises another horizontal recess, and further comprising a connecting rod positioned within the horizontal recesses such that the rear region of the at least one additional electrical contact housing is attached to the plurality of plug-in modules attached to each other side-by-side.

7. The plug-in module circuit board of claim 1 further comprising another plurality of plug-in modules attached to each other front-to-end in a perpendicular column, wherein each of the another plurality of plug-in modules have the least one outer surface with a latching structure, the pair of upper guide bores with the electrical contact and the locking device, and the common electrical voltage connection in communication with each of the electrical contacts of the pair of upper guide bores.

8. The plug-in module circuit board of claim 7, wherein each of the plug-in-modules in the perpendicular column have the same common electrical voltage.

9. The plug-in module circuit board according to claim 1 further comprising a contact spring strip bent upwardly at 90° and extending between the common electrical voltage connection and the electric contacts of the upper guide bores.

10. The plug-in module circuit board according to claim 9, wherein the contact spring strip protrudes from the single wide opening and bends approximately 360° to form the common electrical voltage connection.

11. The plug-in module circuit board according to claim 1, wherein individual connections between the electrical contacts in the upper guide bores and common electrical voltage connection are formed by wire or cross-section sleeve-shaped connecting parts which are bent with a radius towards each other.

12. The plug-in module circuit board according to claim 11, wherein the wire or cross-section sleeve-shaped connecting parts are bent inwardly towards each other in the region of an opening of a lower side of the two upper guide bores such that electrical resistors and jumpers can be connected to the electric contacts of adjacent electric contact housings.

13. The plug-in module circuit board according to claim 1, wherein each of the electrical contact housings comprise a single wide opening for supporting the common electrical voltage connection.

14. The plug-in module circuit board according to claim 13, wherein the single wide opening for supporting the common electrical voltage connection extends 90° to each of the upper guide bores.

15. The plug-in module circuit board according to claim 14, wherein the upper guide bores are positioned in a rear region of the electric contact housing.

16. The plug-in module circuit board according to claim 15, wherein the single wide opening extends from a front region of the electric contact housing towards the rear region of the electric contact housing.

* * * * *